(12) United States Patent
Lee (10) Patent No.: US 7,256,090 B2
(45) Date of Patent: Aug. 14, 2007

(54) METHOD FOR FABRICATING SEMICONDUCTOR DEVICE

(75) Inventor: Sang Bum Lee, Incheon (KR)

(73) Assignee: Dongbu Electronics Co., Ltd., Kangnam-ku, Seoul (KR)

( * ) Notice: Subject to any disclaimer, the term of this patent is extended or adjusted under 35 U.S.C. 154(b) by 281 days.

(21) Appl. No.: 11/024,176

(22) Filed: Dec. 29, 2004

(65) Prior Publication Data

US 2005/0142747 A1    Jun. 30, 2005

(30) Foreign Application Priority Data

Dec. 31, 2003   (KR) .................... 10-2003-0101054
Dec. 31, 2003   (KR) .................... 10-2003-0101055
Dec. 31, 2003   (KR) .................... 10-2003-0101056
Dec. 31, 2003   (KR) .................... 10-2003-0101057

(51) Int. Cl.
    *H01L 21/336*    (2006.01)
(52) U.S. Cl. ............... 438/257; 257/314; 257/315; 438/264
(58) Field of Classification Search .......... 438/257, 438/264; 257/314, 315
    See application file for complete search history.

(56) References Cited

U.S. PATENT DOCUMENTS

| | | | |
|---|---|---|---|
| 5,648,282 A * | 7/1997 | Yoneda | 438/305 |
| 6,194,320 B1 * | 2/2001 | Oi | 438/703 |
| 6,252,276 B1 * | 6/2001 | Ramsbey et al. | 257/321 |
| 6,344,386 B1 * | 2/2002 | Io | 438/238 |
| 2001/0026973 A1 * | 10/2001 | Yeh et al. | 438/239 |
| 2003/0003604 A1 * | 1/2003 | Morita et al. | 438/3 |
| 2003/0003770 A1 * | 1/2003 | Morita et al. | 438/778 |
| 2003/0008458 A1 * | 1/2003 | Hashimoto et al. | 438/258 |

* cited by examiner

*Primary Examiner*—Thao P. Le
(74) *Attorney, Agent, or Firm*—Finnegan, Henderson, Farabow, Garrett & Dunner, L.L.P.

(57) ABSTRACT

Method for fabricating a semiconductor device, including the steps of providing a first conductive type semiconductor substrate having a cell region and a logic region defined thereon, forming a first insulating film, second conductive type polysilicon, and a second insulating film in succession on the semiconductor substrate, selectively removing the first insulating film, the polysilicon, and the second insulating film, to form a floating gate pattern at the cell region, elevating a temperature initially in a state $O_2$ gas is injected, maintaining a fix temperature, and dropping the temperature in a state $N_2$ gas is injected, to form a gate oxide film on a surface of the semiconductor substrate at the logic region, and forming a gate electrode pattern at each of the cell region and the logic region, whereby preventing a threshold voltage of a semiconductor device from dropping due to infiltration of impurities from doped polysilicon at the cell region to the active channel region.

5 Claims, 14 Drawing Sheets

METHOD FOR FABRICATING SEMICONDUCTOR DEVICE

CROSS-REFERENCE TO RELATED APPLICATIONS

This application claims the benefit of Korean Application Nos. P2003-0101054, P2003-0101055, P2003-0101056, P2003-0101057, all of which were filed on Dec. 31, 2003, and are hereby incorporated by reference as if fully set forth herein.

BACKGROUND OF THE INVENTION

1. Field of the Invention

The present invention relates to methods for fabricating a semiconductor device, and more particularly, to a method for fabricating a semiconductor device, which can prevent a threshold voltage of the semiconductor device from dropping caused by infiltration of dopant (impurity) of polysilicon from a cell region into an active channel region.

2. Discussion of the Related Art

In general, in the semiconductor memories, there are volatile memories, and non-volatile memories. Most of the volatile memories are RAMs, such as DRAM (Dynamic Random Access Memory), and SRAM (Static Random Access Memory), and so on, and can receive, and conserve data while power is applied, but can not conserve data when the power is cut off as the data volatilize. Opposite to this, the non-volatile memories, most of which are ROM (Read Only Memory), can conserve data even if no power is applied.

Presently, in view of fabrication process, in the non-volatile memories, there are a floating gate group, and an MIS (Metal Insulator Semiconductor) group in which two or more than two kinds of dielectric films are stacked in two or three layers.

The non-volatile memories in the floating gate group realize a memorizing performance by using a potential well, of which typical one is ETOX (EPROM Tunnel Oxide) which is widely used as a flash EEPROM (Electrically Erasable Programmable Read Only Memory), presently.

On the other hand, the non-volatile memories in the MIS group perform a memorizing function by using traps in a dielectric film bulk, an interface of dielectric films, and an interface of a dielectric film and a semiconductor, of which typical example is the MONOS/SONOS (Metal/Silicon ONO Semiconductor) structure mostly used as a flash EEPROM, presently.

Owing to the advantage of conservation of a stored data even if power is cut off, the non-volatile memories are widely used for storage of data for PC Bios, Set-Top Box, printer, and network server, and recently in digital camera, and cellular phone, and so on.

Figure 1:
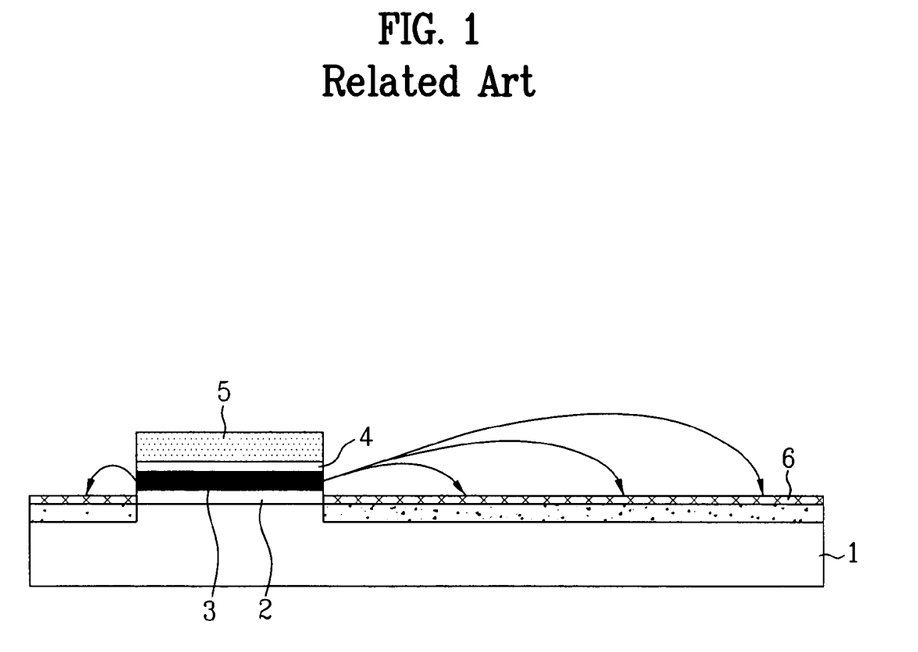
FIG. 1 illustrates a section showing infiltration of impurities into a silicon substrate.

A related art method for fabricating a cell gate of an EEPROM flash memory, and a gate electrode of a peripheral circuit will be described. FIG. 1 illustrates a section showing infiltration of impurities into a silicon substrate.

Referring to FIG. 1, at first, an active cell isolation film (not shown) is formed in a semiconductor substrate 1 at a field region, to define an active region. An ONO (Oxide-Nitride-Oxide) layer 2 is formed on the silicon substrate, and first polysilicon 3 is coated on the ONO layer 2. Then, an insulating film 4 having a stack of an oxide film and a nitride film is formed on the first polysilicon 3.

Photoresist 5 is coated on the insulating film 4, and patterned by exposure and development. Then, the insulating film 4, the first polysilicon 3, and the ONO layer 2 are removed selectively by using the patterned photoresist 5 as a mask, to form a floating gate at the cell region. Then, the photoresist is removed.

Next, the silicon substrate 1 is subjected to thermal oxidation, to form a gate oxide film 6 at a logical circuit region. The thermal oxidation is performed at an elevated temperature in an $N_2$ gas environment. Then, second polysilicon (not shown) is coated on above structure, and patterned, to form gate electrodes at the cell region and the logical circuit region, respectively. The first polysilicon 3 is doped polysilicon.

However, the related art method for fabricating an EEPROM flash memory has the following problems.

That is, because $N_2$ gas is used in formation of the gate oxide film at the logical circuit region by thermal oxidation, dopant makes out diffusion from the first polysilicon to infiltrate into the silicon substrate to act as impurities. The impurities 7 present at a channel region of a transistor in the logical circuit region drops a threshold voltage.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a semiconductor device, which can prevent impurities from infiltrating into an active channel region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device includes the steps of providing a first conductive type semiconductor substrate having a cell region and a logic region defined thereon, forming a first insulating film, second conductive type polysilicon, and a second insulating film in succession on the semiconductor substrate, selectively removing the first insulating film, the polysilicon, and the second insulating film, to form a floating gate pattern at the cell region, elevating a temperature initially in a state $O_2$ gas is injected, maintaining a fix temperature, and dropping the temperature in a state $N_2$ gas is injected, to form a gate oxide film on a surface of the semiconductor substrate at the logic region, and forming a gate electrode pattern at each of the cell region and the logic region.

The first insulating film is an ONO layer having an oxide film having a thickness of 15~25 Å, a nitride film having a thickness of 90~110 Å, and an oxide film having a thickness of 30~50 Å.

The polysilicon is doped with second conductive type impurities and formed to a thickness in a range of 2000~3000 Å.

The second insulating film is a bi-layered film having TEOS (Tetra-ethoxysilane) deposited to a thickness of 100~200 Å, and a nitride film deposited to a thickness of 1200~1800 Å.

The gate oxide film is formed to a thickness of 100~150 Å.

In another aspect of the present invention, a method for fabricating a semiconductor device includes the steps of providing a first conductive type semiconductor substrate having a cell region and a logic region defined thereon, forming a first insulating film, second conductive type polysilicon, and a second insulating film in succession on the semiconductor substrate, selectively removing the first insulating film, the polysilicon, and the second insulating film, to form a floating gate pattern at the cell region, forming a first gate oxide pattern on the semiconductor substrate at the logic region, etching, and removing the first gate oxide film, forming a second gate oxide film on the semiconductor substrate at the logic region, and forming a gate electrode pattern at each of the cell region and the logic region.

The first gate oxide film is removed by wet etching with HF.

Impurities present at the semiconductor substrate are removed at the same time with the removal of the first gate oxide film.

In another aspect of the present invention, a method for fabricating a semiconductor device includes the steps of providing a first conductive type semiconductor substrate having a cell region and a logic region defined thereon, forming a first insulating film, second conductive type polysilicon, and a second insulating film in succession on the semiconductor substrate, selectively removing the second insulating film, and the polysilicon, to form a floating gate pattern at the cell region, forming a sidewall oxide film on sidewalls of the floating gate pattern, selectively removing the first insulating film by using the second insulating film as a mask, forming a gate oxide film on the semiconductor substrate at the logic region, and forming a gate electrode pattern at each of the cell region and the logic region.

The sidewall oxide film is formed to a thickness of 80~120 Å.

In another aspect of the present invention, a method for fabricating a semiconductor device includes the steps of providing a first conductive type semiconductor substrate having a cell region and a logic region defined thereon, forming a first insulating film, and polysilicon in succession on the semiconductor substrate, injecting second conductive type impurity ions into the polysilicon, and forming a second insulating film on the polysilicon, selectively removing the first insulating film, the polysilicon, and the second insulating film, to form a floating gate pattern at the cell region, forming a gate oxide film on a surface of the semiconductor substrate at the logic region, and forming a gate electrode pattern at each of the cell region and the logic region.

The method further includes the step of performing heat treatment after the injection of second conductive type impurity ions into the polysilicon.

The heat treatment is performed at a temperature in a range of 800~1000° C. for 10~30 minutes.

The step of injecting second conductive type impurity ions into the polysilicon includes the step of injecting second conductive type impurity ions into the polysilicon at a dose in a range of $1e^{15}$~$10e^{15}$ ions/cm$^2$, with an ion injection energy in a range of 40~50 keV.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIRST EMBODIMENT

Figure 2A:
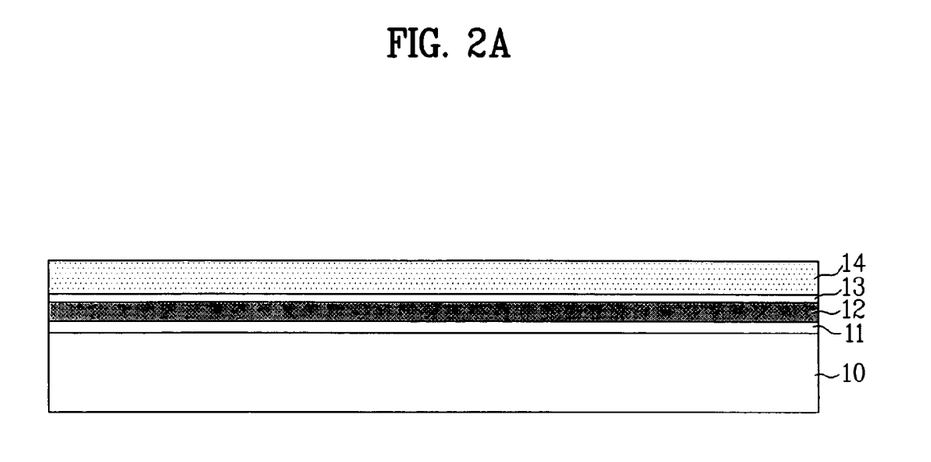
FIGS. 2A~2D illustrate sections showing the steps of a method for fabricating a semiconductor device in accordance with a first preferred embodiment of the present invention.
Figure 2B:
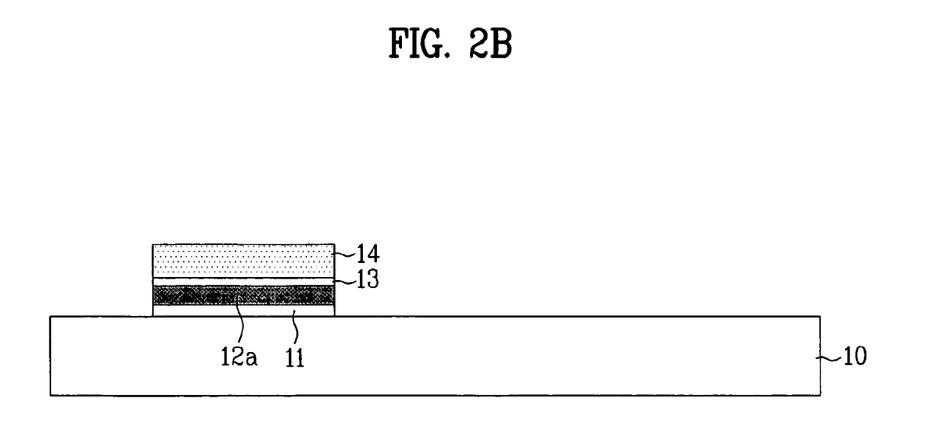
Figure 2C:
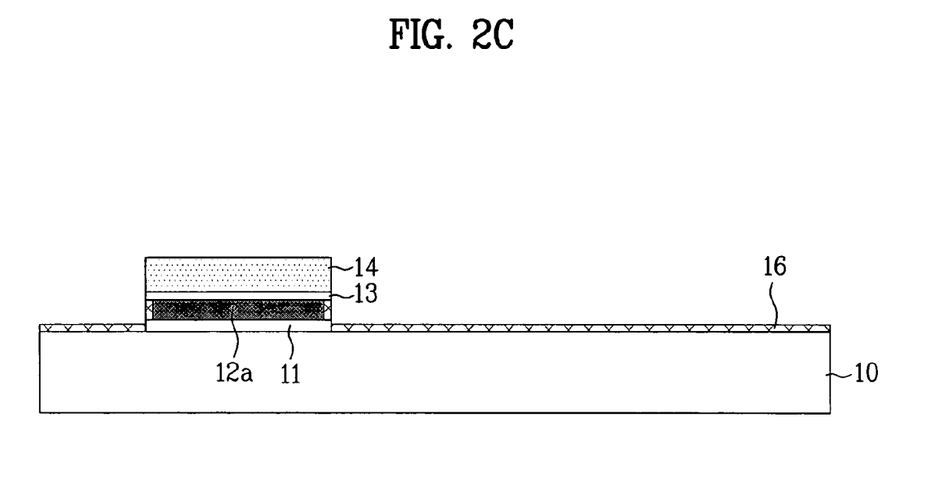
Figure 2D:
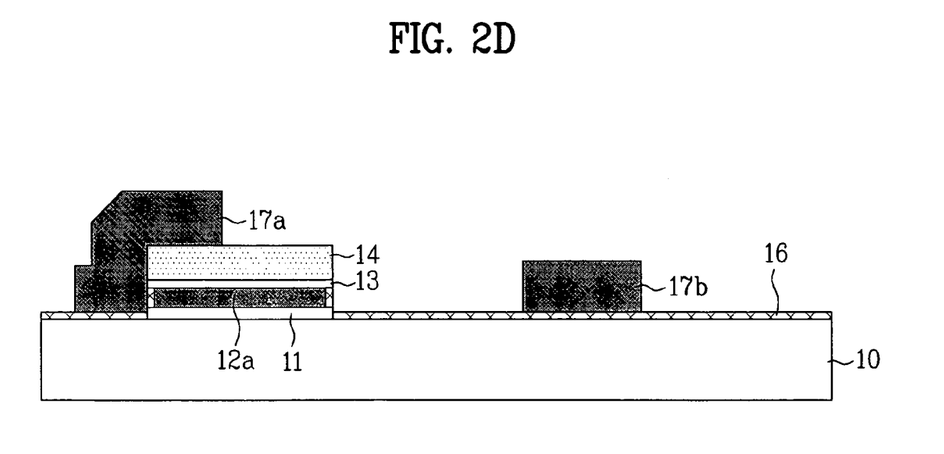
Figure 3:
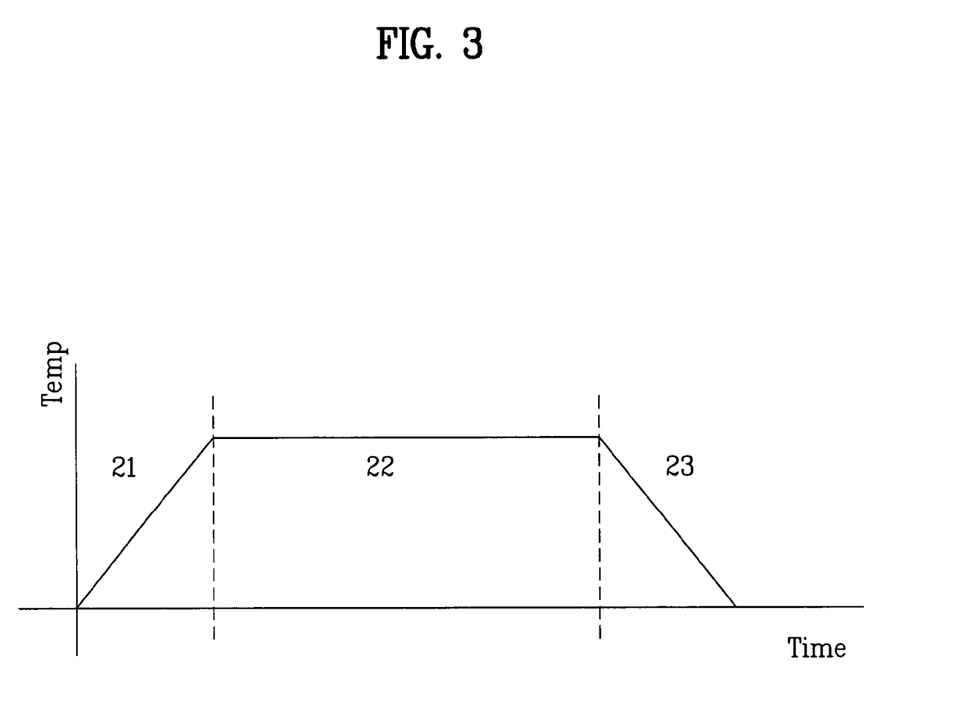
FIG. 3 explains stages of gate oxidation in accordance with a first preferred embodiment of the present invention.

FIGS. 2A~2D illustrate sections showing the steps of a method for fabricating a semiconductor device in accordance with a first preferred embodiment of the present invention, and FIG. 3 explains stages of gate oxidation in accordance with a first preferred embodiment of the present invention.

Referring to FIG. 2A, a first insulating film 11 is formed on a semiconductor substrate 10 having an active cell isolation film formed therein. It is preferable that the first insulating film 11 is an ONO layer having an oxide film having a thickness of 15~25 Å, a nitride film having a thickness of 90~110 Å, and an oxide film having a thickness of 30~50 Å. Then, first polysilicon 12 is deposited on the ONO layer to a thickness of 2000~3000 Å.

The first polysilicon is deposited in a state impurity is doped therein, and if the semiconductor substrate 10 is of a P type, polysilicon heavily doped with N type is used. As the N type impurity, there are P or As.

Then, a second insulating film is deposited on the first polysilicon. It is preferable that the second insulating film is a multilayered film having an oxide film 13 and a nitride film 14. Preferably, the oxide film 13 is deposited of TEOS (Tetra-ethoxysilane) to a thickness of 100~200 Å, and the nitride film 14 is deposited to a thickness of 1200~1800 Å.

Referring to FIG. 2B, the second insulating film 13, and 14, the first polysilicon 12, and the first insulating film 11 are removed selectively, to form a floating gate pattern 12a at the cell region.

That is, photoresist is coated on the second insulating film, and patterned by exposure and development. Then, the second insulating film 13, and 14, the first polysilicon 12, and the first insulating film 11 are etched selectively by using the patterned photoresist as a mask, and the photoresist is removed, to form a floating gate pattern 12a at the cell region.

Referring to FIG. 2C, a gate oxide film 16 is formed at a logical circuit region.

That is, the semiconductor substrate having the floating gate pattern 12a formed thereon is subjected to thermal oxidation, to form a gate oxide film 16 to a thickness of 100~150 Å. As shown in FIG. 3, the thermal oxidation process includes a step 21 for elevating a temperature initially, a step 22 for maintaining a fixed temperature to progress oxidation, and a step 23 for dropping the temperature.

Because $N_2$ gas is used in the stage of elevating a temperature, dopant makes out diffusion from the first polysilicon to infiltrate into the silicon substrate to act as impurities. The impurities present at a channel region of a transistor in the logical circuit region drops a threshold voltage.

Therefore, in the first embodiment of the present invention, $O_2$ gas is used starting from the temperature elevating stage for preventing the dopant from making out diffusion from the floating gate pattern 12a to infiltrate into the silicon substrate, so that influence from the impurities is minimized at the time of formation of a transistor at the logical circuit region after formation of gate oxide film.

That is, $O_2$ gas is injected into a thermal oxidation chamber in the stage of elevating a temperature initially, and $N_2$ gas is injected into the chamber in the stage of dropping the temperature, in formation of the gate oxide film 16. According to this, since an oxide film is formed at a side of the floating gate pattern 12a, the infiltration of dopant from the floating gate pattern 12a to the semiconductor substrate can be prevented.

Referring to FIG. 2D, second polysilicon is deposited on an entire surface of the semiconductor substrate having the gate oxide film 16 formed thereon. Then, photoresist (not shown) is coated on the second polysilicon, and patterned by exposure and development. Then, the second polysilicon is selectively etched by using the patterned photoresist as a mask, to form a control gate pattern 17a at the cell region, and a gate pattern 17b at the logical circuit region.

SECOND EMBODIMENT

In the meantime, after removing the impurities diffused from the first polysilicon to the semiconductor substrate by removing the gate oxide film by wet etching, re-oxidation may be performed to form a gate oxide film, which process will be described as follows.

FIGS. 4A~4E illustrate sections showing the steps of a method for fabricating a semiconductor device in accordance with a second preferred embodiment of the present invention. FIG. 5 illustrates a graph for comparing threshold voltages of channel regions of transistors formed at a logical circuit region in cases re-oxidation is performed in accordance with a second preferred embodiment of the present invention, and the re-oxidation is not performed.

Figure 4A:
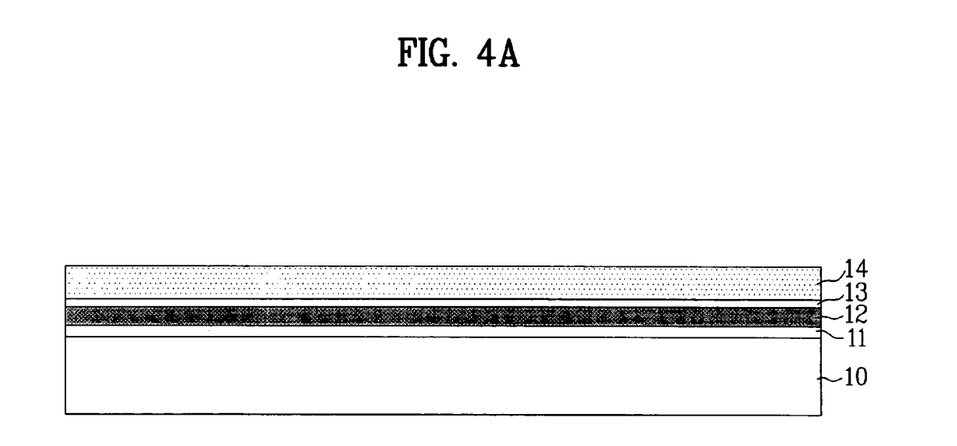
FIGS. 4A~4E illustrate sections showing the steps of a method for fabricating a semiconductor device in accordance with a second preferred embodiment of the present invention.
Figure 5:
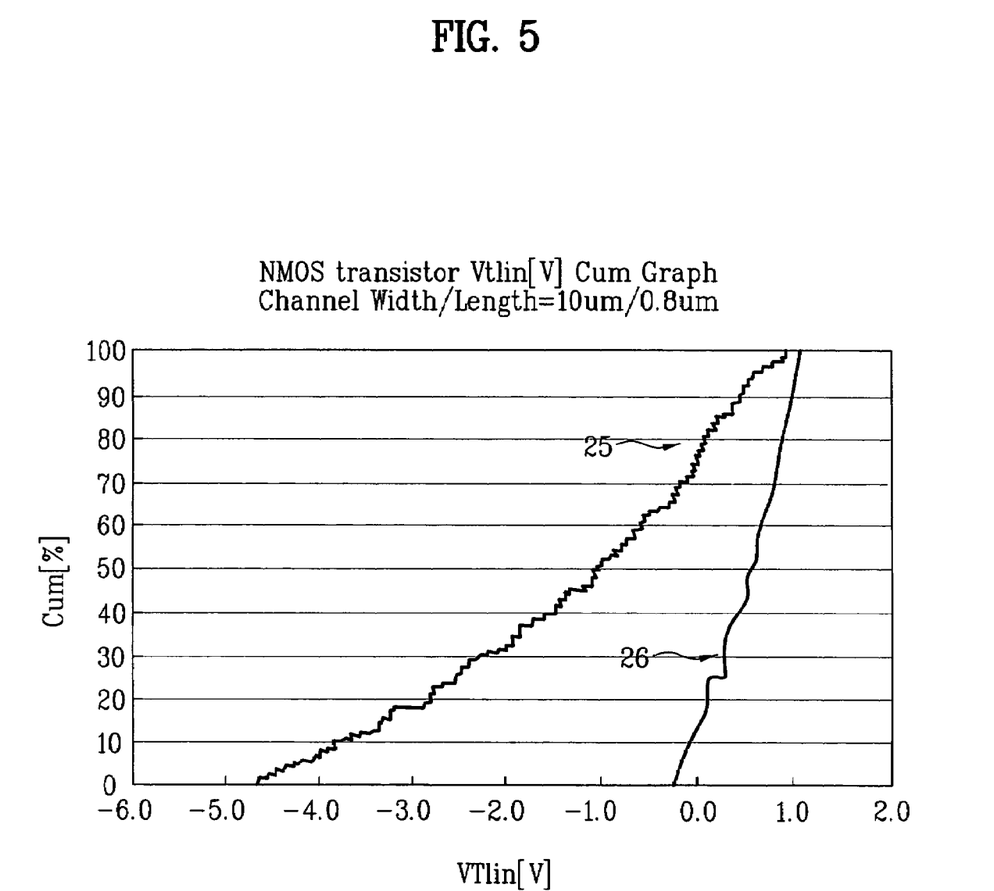
FIG. 5 illustrates a graph for comparing threshold voltages of channel regions of transistors formed at a logical circuit region in cases re-oxidation is performed in accordance with a second preferred embodiment of the present invention, and the re-oxidation is not performed.

Referring to FIG. 4A, a first insulating film 11 is formed on a semiconductor substrate 10 having an active cell isolation film formed therein. It is preferable that the first insulating film 11 is an ONO layer having an oxide film having a thickness of 15~25 Å, a nitride film having a thickness of 90~100 Å, and an oxide film having a thickness of 30~50 Å. Then, first polysilicon 12 is deposited on the ONO layer to a thickness of 2000~3000 Å.

The first polysilicon 12 is deposited in a state impurity is doped therein, and if the semiconductor substrate 10 is of a P type, polysilicon heavily doped with N type is used. As the N type impurity, there are P or As.

Then, a second insulating film is deposited on the first polysilicon. It is preferable that the second insulating film is a multilayered film having an oxide film 13 and a nitride film 14. Preferably, the oxide film 13 is deposited of TEOS (Tetra-ethoxysilane) to a thickness of 100~200 Å, and the nitride film 14 is deposited to a thickness of 1200~1800 Å.

Figure 4B:
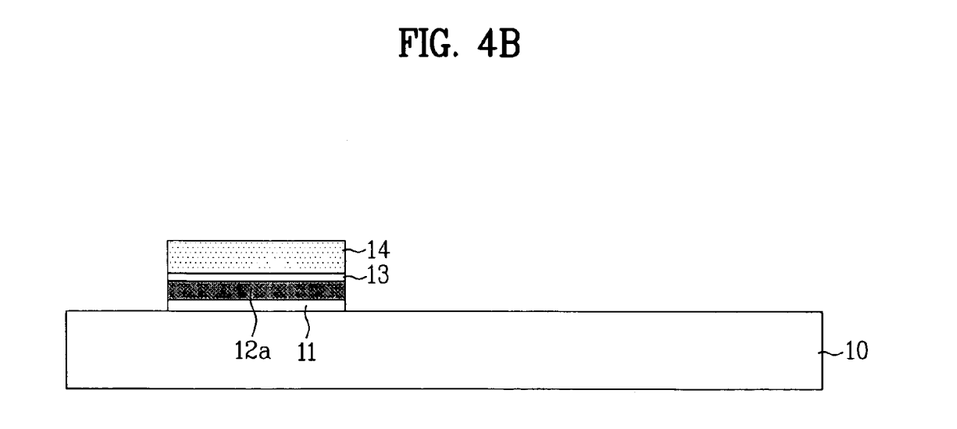

Referring to FIG. 4B, the second insulating film 13, and 14, the first polysilicon 12, and the first insulating film 11 are removed selectively, to form a floating gate pattern 12a at the cell region.

That is, photoresist is coated on the second insulating film, and patterned by exposure and development. Then, the second insulating film 13, and 14, the first polysilicon 12, and the first insulating film 11 are etched selectively by using the patterned photoresist as a mask, and the photoresist is removed, to form a floating gate pattern 12a at the cell region.

Figure 4C:
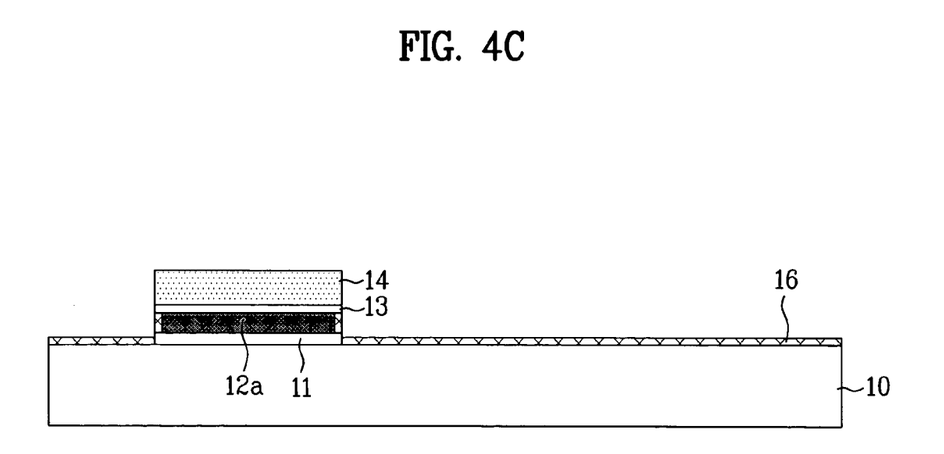

Referring to FIG. 4C, a gate oxide film 16 is formed at a logical circuit region to a thickness of 100~150 Å. Then, the first gate oxide film 16 is removed by wet etching with HF, and at the same time with this, the impurities diffused to the semiconductor substrate 10 from the floating gate pattern 12a at the time of formation of the first gate oxide film 16 is removed.

Figure 4D:
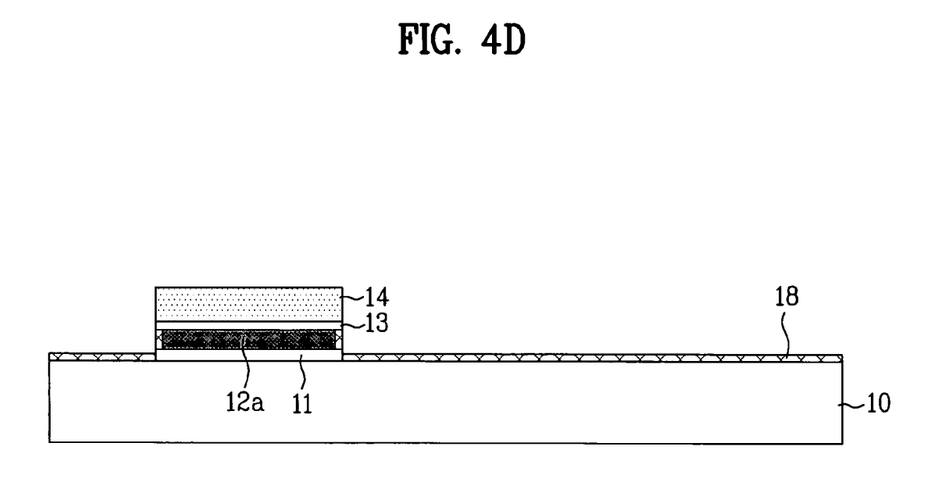

Referring to FIG. 4D, re-oxidation is performed to form a second gate oxide film 18 on the semiconductor substrate 10 at the logical circuit region to a thickness of 100~150 Å, again.

Figure 4E:
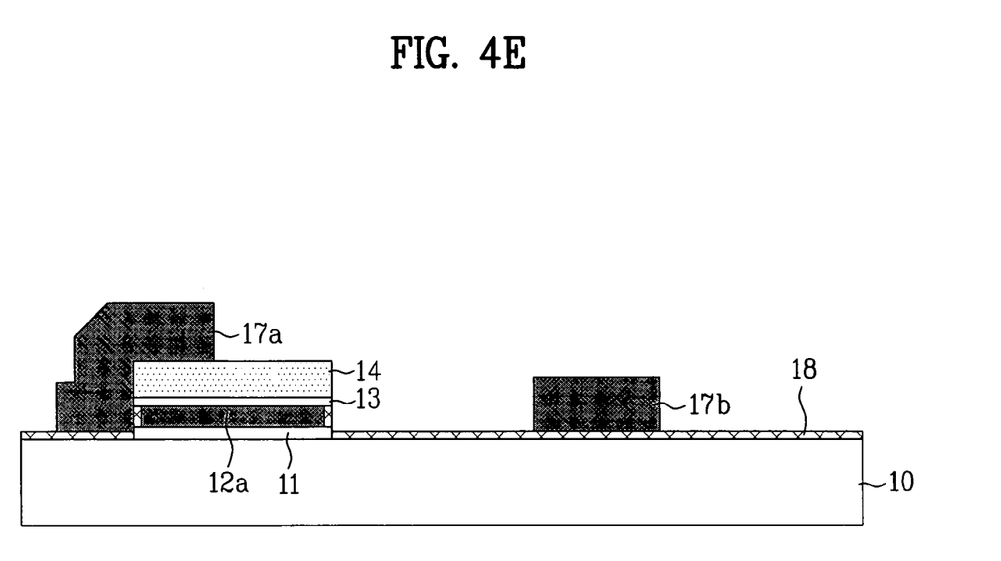

Referring to FIG. 4E, second polysilicon is deposited on an entire surface of the semiconductor substrate having the second gate oxide film 18 formed thereon. Then, photoresist (not shown) is coated on the second polysilicon, and patterned by exposure and development. Then, the second polysilicon is selectively etched by using the patterned photoresist as a mask, to form a control gate pattern 17a at the cell region, and a gate pattern 17b at the logical circuit region.

Thus, the method for fabricating a semiconductor device in accordance with a second preferred embodiment of the present invention can prevent the threshold voltage of the transistor from dropping due to impurities.

That is, as can be known from FIG. 5, a graph 25 of a case the re-oxidation is not performed has a wide distribution of the threshold voltage of the transistor at the logical circuit region, leading to have an unstable device performance, and a graph 26 of a case the re-oxidation is performed has a distribution of the threshold voltage more regular than the graph of the case no re-oxidation is performed.

THIRD EMBODIMENT

In the meantime, by forming a sidewall insulating film at sides of the floating gate pattern, the drop of the threshold voltage of the transistor can be prevented, which will be described in detail, as follows.

FIGS. 6A~6E illustrate sections showing the steps of a method for fabricating a semiconductor device in accordance with a third preferred embodiment of the present invention.

Figure 6A:
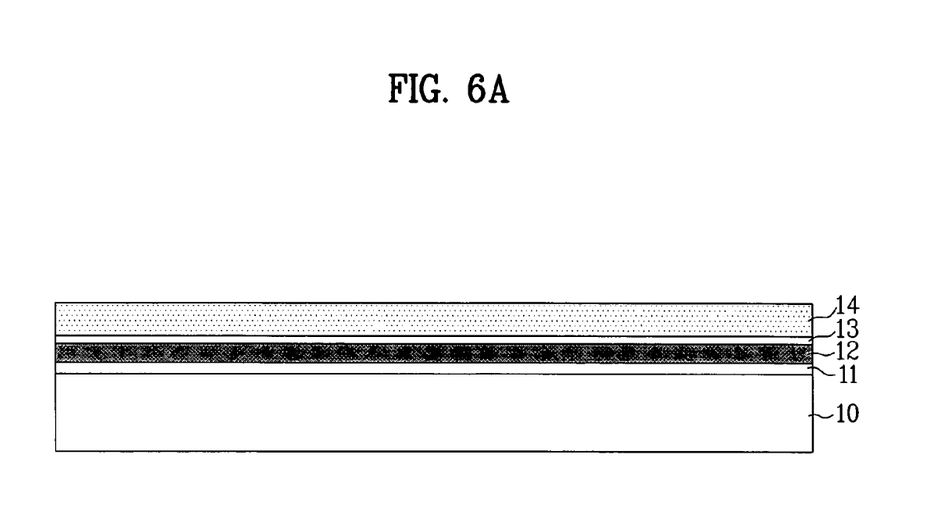
FIGS. 6A~6E illustrate sections showing the steps of a method for fabricating a semiconductor device in accordance with a third preferred embodiment of the present invention.

Referring to FIG. 6A, a first insulating film 11 is formed on a semiconductor substrate 10 having an active cell isolation film formed therein. It is preferable that the first insulating film 11 is an ONO layer having an oxide film having a thickness of 15~25 Å, a nitride film having a thickness of 90~110 Å, and an oxide film having a thickness of 30~50 Å. Then, first polysilicon 12 is deposited on the ONO layer to a thickness of 2000~3000 Å.

The first polysilicon is deposited in a state impurity is doped therein, and if the semiconductor substrate 10 is of a P type, polysilicon heavily doped with N type is used. As the N type impurity, there are P or As.

Then, a second insulating film is deposited on the first polysilicon 12. It is preferable that the second insulating film is a multilayered film having an oxide film 13 and a nitride film 14. Preferably, the oxide film 13 is deposited of TEOS (Tetra-ethoxysilane) to a thickness of 100~200 Å, and the nitride film 14 is deposited to a thickness of 1200~1800 Å.

Figure 6B:
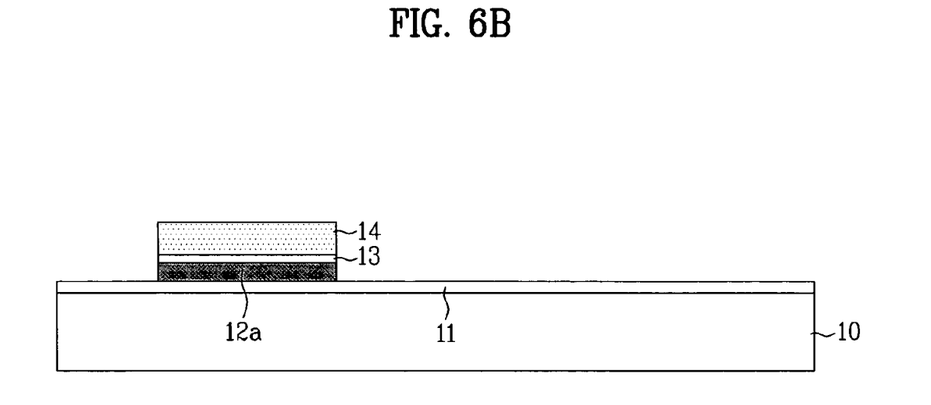

Referring to FIG. 6B, the second insulating film 13, and 14, and the first polysilicon 12 are removed selectively, to form a floating gate pattern 12a at the cell region.

That is, photoresist is coated on the second insulating film, and patterned by exposure and development. Then, the second insulating film 13, and 14, and the first polysilicon 12 are etched selectively by using the patterned photoresist as a mask, and the photoresist is removed, to form a floating gate pattern 12a at the cell region.

Figure 6C:
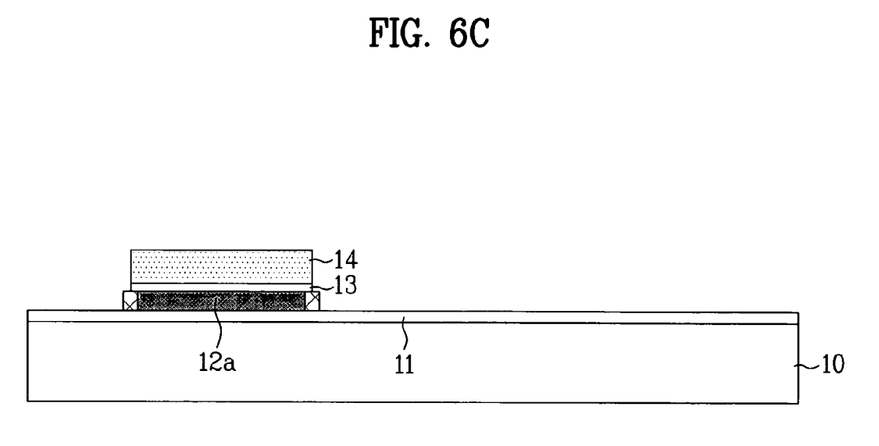

Referring to FIG. 6C, a side oxide film 19 is formed at sidewalls of the floating gate pattern 12a, for preventing impurities from out diffusing from the floating gate pattern 12a in a following process. The sidewall oxide film 19 is formed to a thickness of 80~120 Å, preferably 100 Å.

Figure 6D:
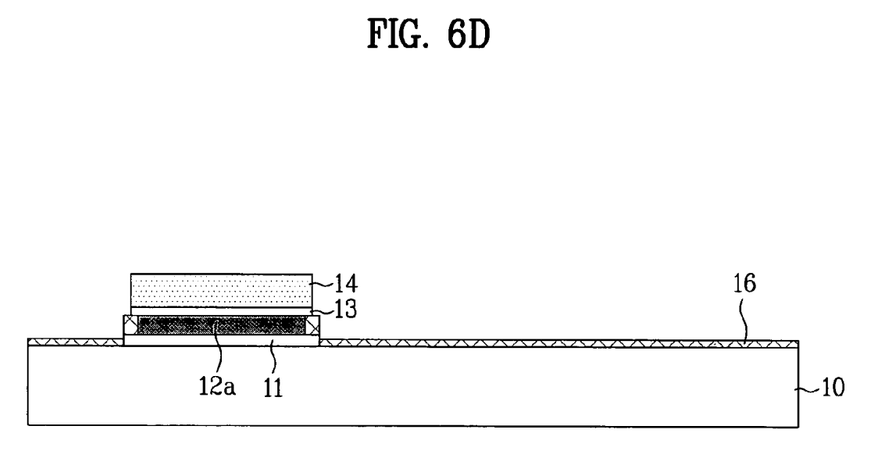

Referring to FIG. 6D, the first insulating film 11 is etched by using the second insulating film 13, and 14 as a mask, and the semiconductor substrate 10 is subjected to thermal oxidation, to form a gate oxide film 16 to a thickness of 100~150 Å.

Figure 6E:
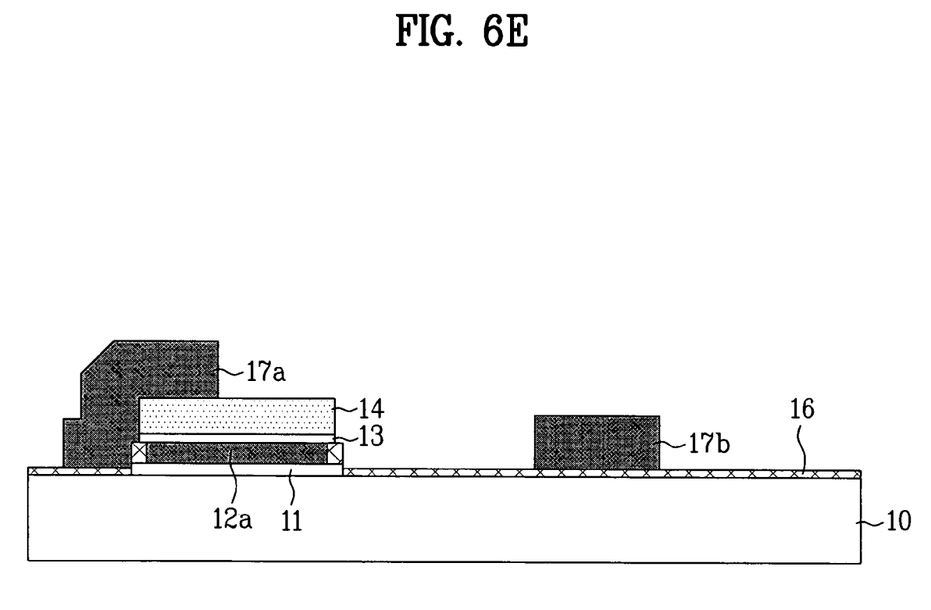

Referring to FIG. 6E, second polysilicon is deposited on an entire surface of the semiconductor substrate having the gate oxide film 16 formed thereon. Then, photoresist (not shown) is coated on the second polysilicon, and patterned by exposure and development. Then, the second polysilicon is selectively etched by using the patterned photoresist as a mask, to form a control gate pattern 17a at the cell region, and a gate pattern 17b at the logical circuit region.

Thus, the method for fabricating a semiconductor device in accordance with a third preferred embodiment of the present invention can prevent the threshold voltage of the transistor from dropping due to impurities.

FOURTH EMBODIMENT

In the meantime, by depositing undoped polysilicon as first polysilicon for a floating gate pattern, and doping the first polysilicon with impurities, dropping of a threshold voltage of a transistor can be prevented, which will be described in detail.

Figure 7A:
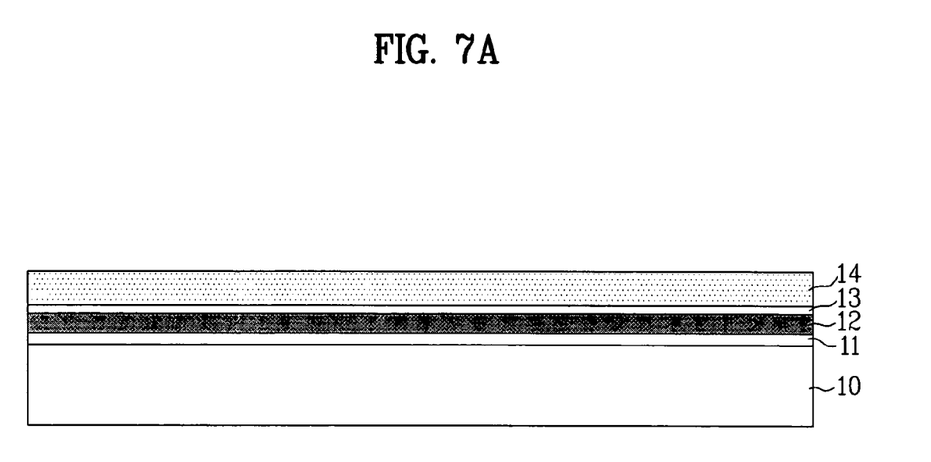
FIGS. 7A~7D illustrate sections showing the steps of a method for fabricating a semiconductor device in accordance with a second preferred embodiment of the present invention.
Figure 7B:
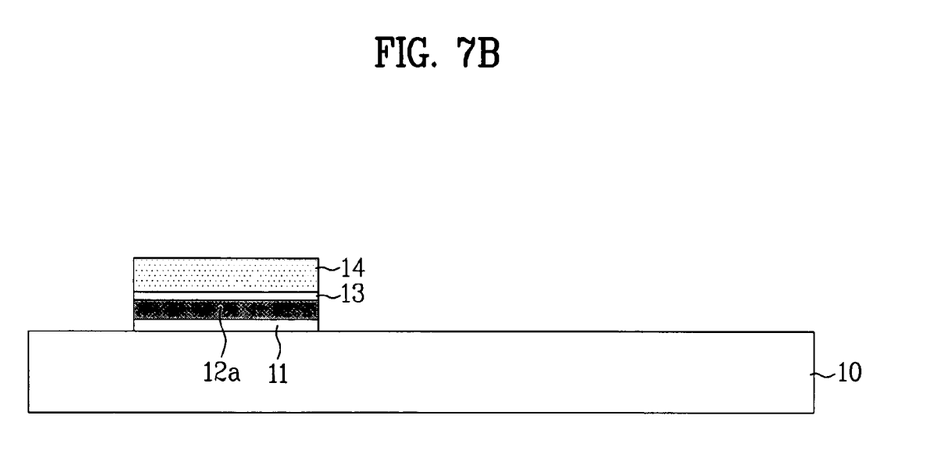
Figure 7C:
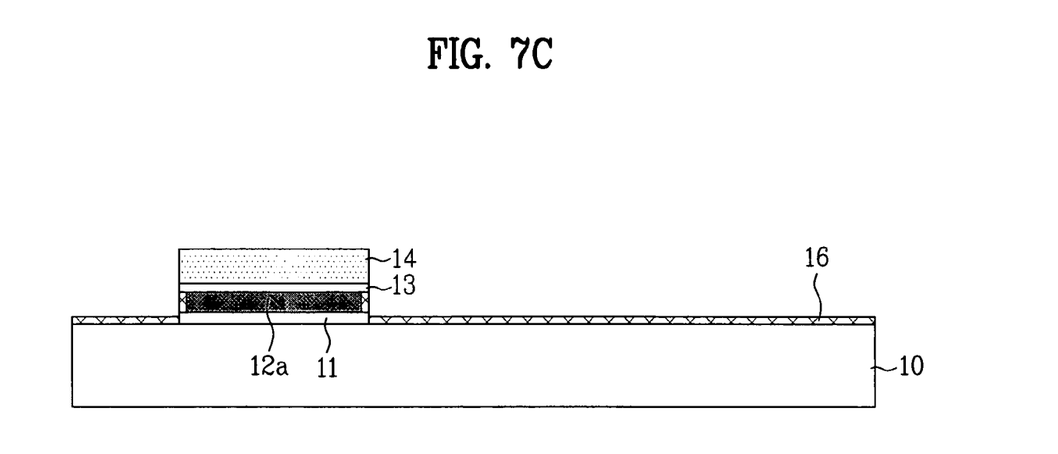
Figure 7D:
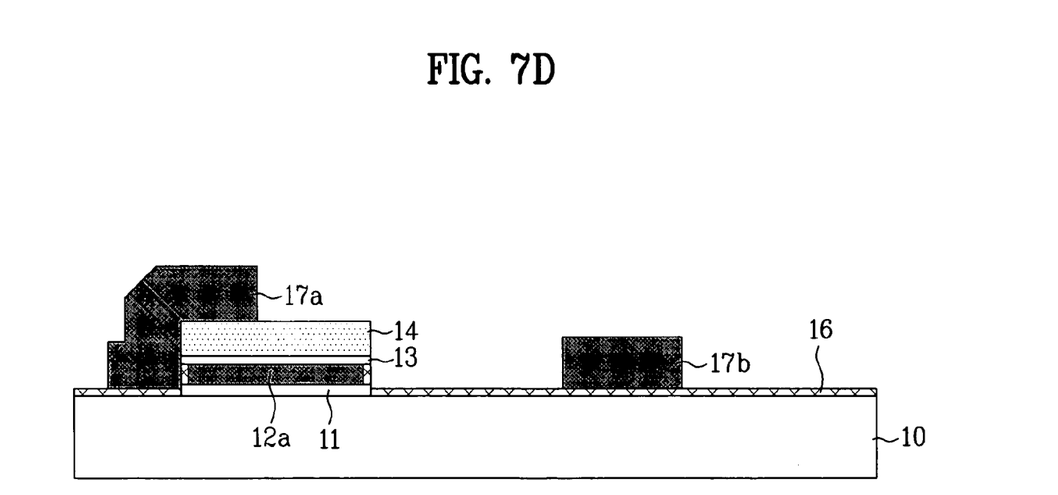
Figure 8:
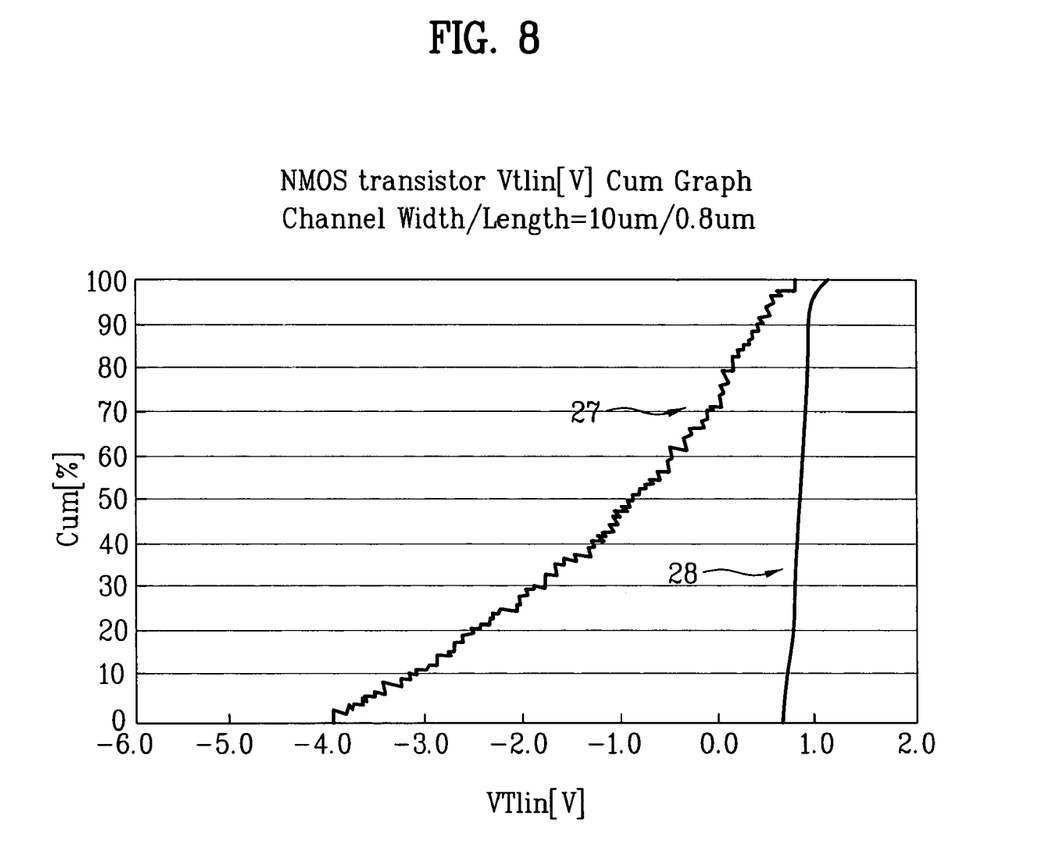
FIG. 8 illustrates a graph for comparing threshold voltages of channel regions of transistors formed at a logical circuit region in a case undoped polysilicon is deposited, and impurities are doped therein later in accordance with the fourth embodiment of the present invention, and a case doped polysilicon is deposited.

FIGS. 7A~7D illustrate sections showing the steps of a method for fabricating a semiconductor device in accordance with a second preferred embodiment of the present invention, and FIG. 8 illustrates a graph for comparing threshold voltages of channel regions of transistors formed at a logical circuit region in a case undoped polysilicon is deposited, and impurities are doped therein later in accordance with the fourth embodiment of the present invention, and a case doped polysilicon is deposited.

Referring to FIG. 7A, a first insulating film 11 is formed on a semiconductor substrate 10 having an active cell isolation film formed therein. It is preferable that the first insulating film 11 is an ONO layer having an oxide film having a thickness of 15~25 Å, a nitride film having a thickness of 90~100 Å, and an oxide film having a thickness of 30~50 Å. Then, first polysilicon 12 is deposited on the ONO layer to a thickness of 2000~3000 Å. The first polysilicon 12 is in an undoped state.

Then, impurity ions are injected into the first polysilicon 12, and the first polysilicon 12 is heat treated. If the semiconductor substrate 10 is of a P type, the impurity is P or As. Dosage of the impurity ions is in a range of $1e^{15} \sim 10e^{15}$ ions/cm$^2$, with an ion injection energy in a range of 40~50 keV. Preferably, Dosage of the impurity ions is in a range of $5e^{15}$ ions/cm$^2$, with an ion injection energy of 45 keV. The heat treatment is performed at a temperature in a range of 800~1000° C. for 10~30 min., preferably, at a temperature in a range of 900° C. for 20 min.

Then, a second insulating film is deposited on the first polysilicon. It is preferable that the second insulating film is a multilayered film having an oxide film 13 and a nitride film 14. Preferably, the oxide film 13 is deposited of TEOS (Tetra-ethoxysilane) to a thickness of 100~200 Å, and the nitride film 14 is deposited to a thickness of 1200~1800 Å.

Referring to FIG. 7B, the second insulating film 13, and 14, the first polysilicon 12, and the first insulating film 11 are removed selectively, to form a floating gate pattern 12a at the cell region.

That is, photoresist is coated on the second insulating film, and patterned by exposure and development. Then, the second insulating film 13, and 14, the first polysilicon 12, and the first insulating film 11 are etched selectively by using the patterned photoresist as a mask, and the photoresist is removed, to form a floating gate pattern 12a at the cell region.

Referring to FIG. 7C, a gate oxide film 16 is formed at a logical circuit region.

That is, the semiconductor substrate having the floating gate pattern 12a formed thereon is subjected to thermal oxidation, to form a gate oxide film 16 to a thickness of 100~150 Å. In this instance, an oxide film is formed at sides of the floating gate pattern 12a.

Referring to FIG. 7D, second polysilicon is deposited on an entire surface of the semiconductor substrate having the gate oxide film 16 formed thereon. Then, photoresist (not shown) is coated on the second polysilicon, and patterned by exposure and development. Then, the second polysilicon is selectively etched by using the patterned photoresist as a mask, to form a control gate pattern 17a at the cell region, and a gate pattern 17b at the logical circuit region.

Thus, the method for fabricating a semiconductor device in accordance with a fourth preferred embodiment of the present invention can prevent the threshold voltage of the transistor from dropping due to impurities.

That is, as can be known from FIG. 8, a graph 27 of a case the doped first polysilicon is deposited has a wide distribution of the threshold voltage of the transistor at the logical circuit region, leading to have an unstable device performance, and a graph 28 of a case the undoped first polysilicon is deposited, and the impurity ions are injected therein later has a distribution of the threshold voltage more regular than the graph of the case the doped first polysilicon is deposited.

As has been described, the method for fabricating a semiconductor device of the present invention has the following advantage.

That is, the prevention of infiltration of impurities into an active channel region permits to stabilize performances of a semiconductor device, such as threshold voltage, and the like.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device, comprising the steps of:

provided a first conductive type semiconductor substrate having a cell region and a logic region defined thereon;

forming a first insulating film, second conductive type polysilicon, and a second insulating film in succession on the semiconductor substrate;

selectively removing the first insulating film, the polysilicon, and the second insulating film, to form a floating gate pattern at the cell region;

elevating a temperature initially in a state $O_2$ gas is injected, maintaining a fix temperature, and dropping the temperature in a state $N_2$ gas is injected, to form a gate oxide film on a surface of the semiconductor substrate at the logic region; and forming a gate electrode pattern at each of the cell region and the logic region.

2. The method as claimed in claim 1, wherein the first insulating film is an ONO layer having an oxide film having a thickness of 15~25 Å, a nitride film having a thickness of 90~110 Å, and an oxide film having a thickness of 30~50 Å.

3. The method as claimed in claim 1, wherein the polysilicon is doped with second conductive type impurities and formed to a thickness in a range of 2000~3000 Å.

4. The method as claimed in claim 1, wherein the second insulating film is a bi-layered film having TEOS (Tetraethoxysilane) deposited to a thickness of 100~200 Å, and a nitride film deposited to a thickness of 1200~1800 Å.

5. The method as claimed in claim 1, wherein the gate oxide film is formed to a thickness of 100~150 Å.

* * * * *